United States Patent
Cha

(10) Patent No.: US 8,557,694 B2
(45) Date of Patent: Oct. 15, 2013

(54) METHOD FOR FORMING GATE OF SEMICONDUCTOR DEVICE

(75) Inventor: Han-Seob Cha, Chungcheongbuk-do (KR)

(73) Assignee: MagnaChip Semiconductor, Ltd., Chungcheongbuk-do (KR)

( * ) Notice: Subject to any disclaimer, the term of this patent is extended or adjusted under 35 U.S.C. 154(b) by 267 days.

(21) Appl. No.: 12/468,325

(22) Filed: May 19, 2009

(65) Prior Publication Data

US 2009/0311854 A1   Dec. 17, 2009

(30) Foreign Application Priority Data

Jun. 11, 2008  (KR) .............................. 2008-0054886
Jun. 11, 2008  (KR) .............................. 2008-0054892
Oct. 13, 2008  (KR) .............................. 2008-0100229

(51) Int. Cl.
  *H01L 21/4763*  (2006.01)
(52) U.S. Cl.
  USPC ....................... 438/585; 257/217; 257/E21.19
(58) Field of Classification Search
  None
  See application file for complete search history.

(56) References Cited

U.S. PATENT DOCUMENTS

| | | | |
|---|---|---|---|
| 6,027,970 A * | 2/2000 | Sharan et al. | 438/255 |
| 6,146,970 A * | 11/2000 | Witek et al. | 438/424 |
| 6,767,813 B2 | 7/2004 | Lee et al. | |
| 2002/0025759 A1 * | 2/2002 | Lee et al. | 451/36 |
| 2003/0139012 A1 * | 7/2003 | Yamauchi et al. | 438/269 |
| 2004/0075122 A1 | 4/2004 | Lin et al. | |
| 2004/0262676 A1 * | 12/2004 | Lee et al. | 257/328 |
| 2006/0115933 A1 | 6/2006 | Ye et al. | |
| 2006/0246671 A1 * | 11/2006 | Jang et al. | 438/294 |
| 2007/0066005 A1 * | 3/2007 | Hieda et al. | 438/207 |
| 2007/0120183 A1 * | 5/2007 | Lee et al. | 257/330 |
| 2007/0170511 A1 * | 7/2007 | Huang | 257/355 |
| 2008/0277743 A1 * | 11/2008 | Cho et al. | 257/407 |
| 2008/0318428 A1 * | 12/2008 | Ding et al. | 438/693 |

FOREIGN PATENT DOCUMENTS

| | | | |
|---|---|---|---|
| KR | 10-2001-0008524 A | | 2/2001 |
| KR | 10-2004-0036858 | | 5/2004 |
| KR | 10-2005-0028573 | | 3/2005 |
| KR | 10-2005-0047556 A | | 5/2005 |
| KR | 2006039650 A | * | 5/2006 |
| KR | 10-2007-0098452 | | 10/2007 |
| KR | 10-2008-0060328 | | 7/2008 |
| KR | 10-2008-0068997 | | 7/2008 |

* cited by examiner

*Primary Examiner* — Evan Pert
*Assistant Examiner* — Joseph Galvin, III
(74) *Attorney, Agent, or Firm* — Morgan, Lewis & Bockius LLP

(57) ABSTRACT

A method for forming a triple gate of a semiconductor device is provided. The method includes: forming a buffer layer and a hard mask over a substrate; etching the hard mask and the buffer layer to form a hard mask pattern and a buffer pattern; forming first and second trenches spaced apart within the substrate by partially etching the substrate by a vapor etching process using the hard mask pattern as an etching barrier layer; forming a buried insulation layer to fill the first and second trenches; removing the hard mask pattern and the buffer pattern; forming a gate insulation layer over the substrate between the first trench and the second trench; forming a conductive layer to cover the gate insulation layer; and etching the conductive layer to form a gate electrode.

16 Claims, 14 Drawing Sheets

METHOD FOR FORMING GATE OF SEMICONDUCTOR DEVICE

CROSS-REFERENCES TO RELATED APPLICATIONS

The present invention claims priority of Korean Patent Application Nos. 10-2008-0054886, 10-2008-0054892, and 10-2008-0100229, filed on Jun. 11, 2008, Jun. 11, 2008, and Oct. 13, 2008, respectively, which are incorporated herein by reference.

BACKGROUND OF THE INVENTION

1. Field of the Invention

The present invention relates to a semiconductor fabrication technology; and more particularly, to a method for forming a gate of a semiconductor device.

2. Description of Related Art

As integration density of semiconductor devices is increasing, a channel length of a transistor is reduced and concentrations of a source and a drain are gradually increased. Thus, severe interference between the source and the drain causes a short channel effect that reduces a threshold voltage and increases leakage current. In order to suppress the short channel effect, intensive researches have been made on a recess gate type transistor and a triple gate type transistor among transistors with polyhedral channel.

According to a method for forming a recess gate type transistor, a substrate of a channel region is etched to a certain depth to form a trench, and a gate insulation layer is formed along an inner surface of the trench. Then, a gate is formed on the gate insulation layer to fill the trench. In such a structure, electrical properties are remarkably improved because interference between a source and a drain is suppressed.

However, in the method for forming the recess gate type transistor, since the substrate is etched by a plasma etching process, a region for channel is damaged by plasma, causing crystal defects such as stacking fault. Thus, interface trap density is increased. Furthermore, surface roughness is degraded due to characteristic of plasma etching. Moreover, when a trench is formed by etching the substrate, an upper edge portion is formed sharply and an electric field is concentrated on the sharp upper edge portion, resulting in degradation in characteristic and reliability of the device.

Next, problems of the triple gate type transistor will be described.

FIG. 1 is a perspective view for explaining a typical triple gate type transistor.

Referring to FIG. 1, the typical triple gate type transistor has channels on three surfaces: two sides (sidewalks) and an upper surface. Since the two sides are formed as the channel, a much larger current can be obtained even though a device has the same size. In FIG. 1, reference symbols "G", "D" and "S" represent a gate electrode, a drain region, and a source region, respectively.

FIG. 2 is a perspective view explaining problems of the typical triple gate type transistor.

Referring to FIG. 2, a substrate is etched in order for using sides as a channel. At this point, a plasma etching process is usually used.

Such a plasma etching process has three problems as follows.

First, crystal defect is caused by plasma damage. If crystal defect caused by plasma damage occurs in the side A to be used as a channel, device characteristics are degraded. In particular, the reliability of the device is degraded.

Second, the use of the plasma etching process degrades surface roughness such as striation that is inevitably formed in the side A during the plasma etching process. The surface roughness of the side A reduces carrier mobility, thus degrading device characteristic.

Third, electric field concentration occurs in the upper edge portion B. When the radius of curvature of the edge portion B is small, an electric field applied to a gate oxide layer increases. Thus, failure of the gate oxide layer is caused, or the lifespan of the gate oxide layer is reduced. As illustrated in FIG. 3, when the radius of curvature is 7 nm, a higher electric field is applied to the edge portion than a flat portion by approximately 9%.

SUMMARY OF THE INVENTION

An embodiment of the present invention is directed to providing a method for forming a gate of a semiconductor device, which is capable of preventing characteristic and reliability of the device from being degraded by a plasma etching process.

Another embodiment of the present invention is directed to providing a method for forming a gate of a semiconductor device, which is capable of preventing electric field concentration from occurring at an upper edge portion due to a plasma etching process.

In accordance with an aspect of the present invention, there is provided a method for forming a triple gate of a semiconductor device, the method including: preparing a substrate including a support substrate, a buried insulation layer, and a semiconductor layer; etching the semiconductor layer by a vapor etching process to form first and second trenches spaced part from each other; forming a gate insulation layer over the substrate including the first and second trenches; and forming a gate conductive layer over the gate insulation layer.

In accordance with another aspect of the present invention, there is provided a method for forming a triple gate of a semiconductor device, the method including: forming a buffer layer and a hard mask over a substrate; etching the hard mask and the buffer layer to form a hard mask pattern and a buffer pattern; forming first and second trenches spaced apart within the substrate by partially etching the substrate by a vapor etching process using the hard mask pattern as an etching barrier layer; forming a buried insulation layer to fill the first and second trenches; removing the hard mask pattern and the buffer pattern; forming a gate insulation layer over the substrate between the first trench and the second trench; forming a conductive layer to cover the gate insulation layer; and etching the conductive layer to form a gate electrode.

In accordance with another aspect of the present invention, there is provided a method for forming a recess gate of a semiconductor device, the method including: etching a part of a substrate by a vapor etching process to form a trench; forming a gate insulation layer over the substrate along an inner surface of the trench; forming a conductive layer over the gate insulation layer; and etching the conductive layer and the gate insulation layer to form a gate electrode.

In accordance with another aspect of the present invention, there is provided a method for forming a recess gate of a semiconductor device, the method including: preparing a substrate where a buffer layer is formed; etching a part of the buffer layer to expose the substrate; forming a trench by etching a part of the substrate by a vapor etching process using the buffer layer as an etching stop layer; removing the buffer layer; forming a gate insulation layer over the substrate along an inner surface of the trench; forming a conductive layer over the gate insulation layer; and etching the conductive layer and the gate insulation layer to form a gate electrode.

Other objects and advantages of the present invention can be understood by the following description, and become apparent with reference to the embodiments of the present invention. Also, it is obvious to those skilled in the art to which the present invention pertains that the objects and advantages of the present invention can be realized by the means as claimed and combinations thereof.

DESCRIPTION OF SPECIFIC EMBODIMENTS

Figure 1:
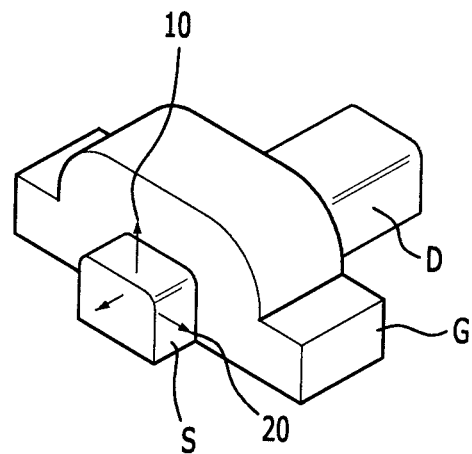
FIG. 1 is a perspective view explaining a typical triple gate type transistor.
Figure 2:
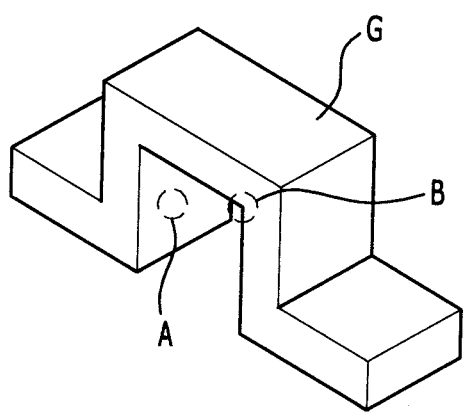
FIG. 2 is a perspective view explaining problems of the typical triple gate type transistor.
Figure 3:
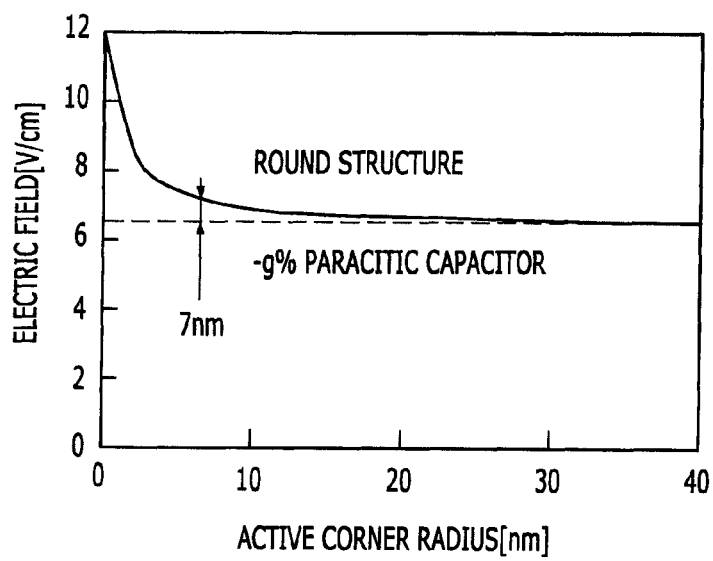
FIG. 3 is a graph showing electric field concentration according to the radius of curvature.

The advantages, features and aspects of the invention will become apparent from the following description of the embodiments with reference to the accompanying drawings, which is set forth hereinafter.

Referring to the drawings, the illustrated thickness of layers and regions are exaggerated to facilitate explanation. When a first layer is referred to as being "on" a second layer or "on" a substrate, it could mean that the first layer is formed directly on the second layer or the substrate, or it could also mean that a third layer may exist between the first layer and the substrate. Furthermore, the same or like reference numerals represent the same or like constituent elements, although they appear in different embodiments or drawings of the present invention.

Embodiment 1

Figure 4:
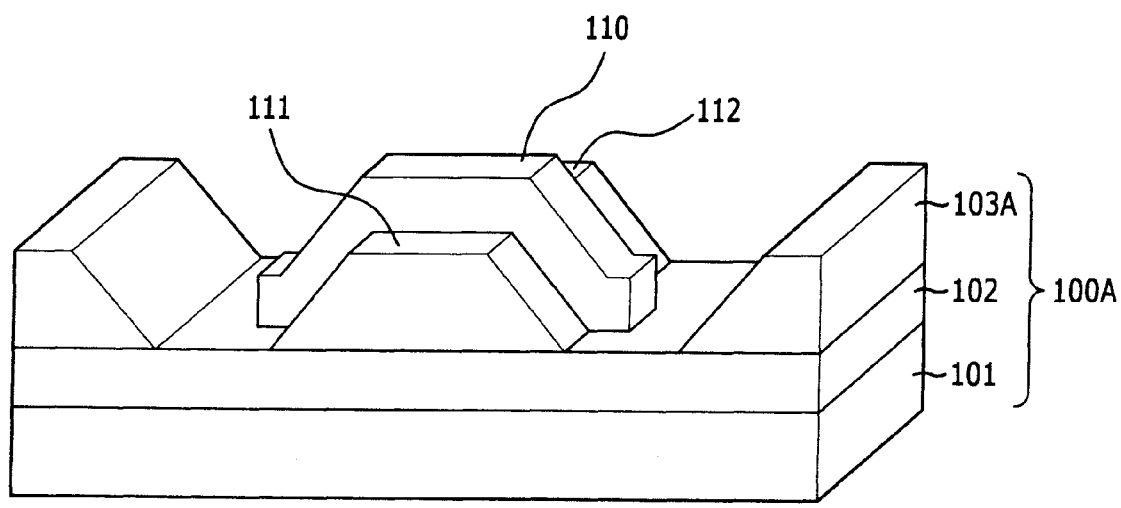
FIG. 4 is a perspective view of a triple gate formed by a method for forming a triple gate of a semiconductor device in accordance with a first embodiment of the present invention.

FIG. 4 is a perspective view of a triple gate formed by a method for forming a triple gate of a semiconductor device in accordance with a first embodiment of the present invention. FIGS. 5A to 5G are cross-sectional views illustrating a method for forming a triple gate of a semiconductor device in accordance with a first embodiment of the present invention.

Figure 5A:
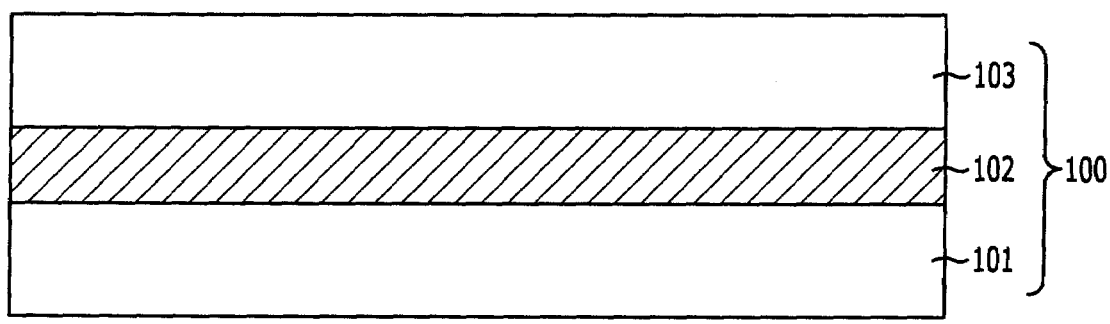
FIGS. 5A to 5C are cross-sectional views illustrating a method for forming a triple gate of a semiconductor device in accordance with a first embodiment of the present invention.

Referring to FIG. 5A, a substrate 100 is prepared. The substrate 100 is a silicon-on-insulator (SOI) substrate and includes a support substrate 101, a buried insulation layer 102, and a semiconductor layer 103. The buried insulation layer 102 is formed of oxide to a thickness of approximately 100 Å or more, specifically, approximately 100 Å to approximately 1,000 Å. The semiconductor layer 103 is formed to a thickness of approximately 300 Å or more, specifically, approximately 300 Å to approximately 1,000 Å. The semiconductor layer 103 may include an epitaxial layer.

Figure 5B:
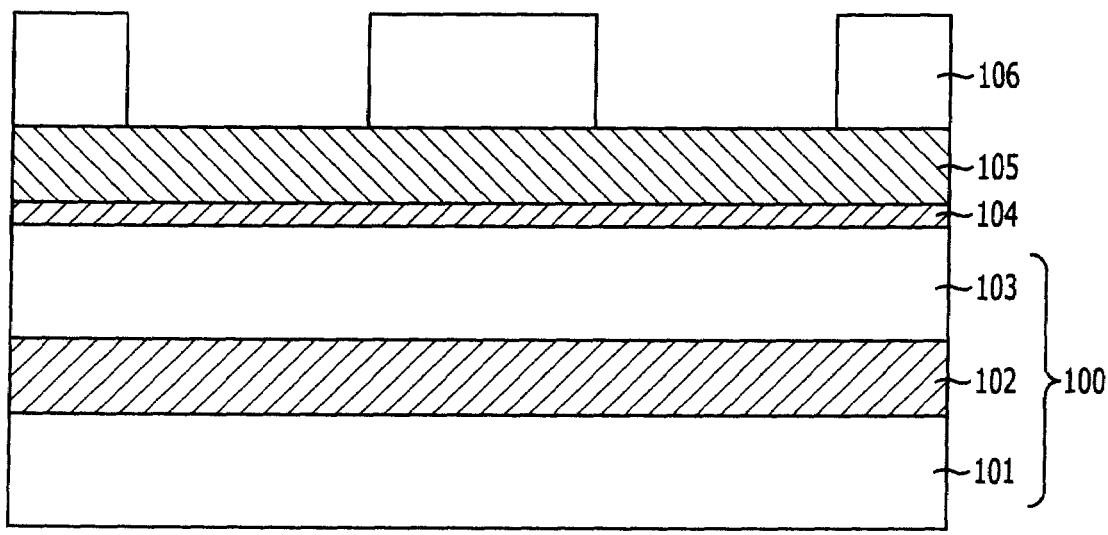

Referring to FIG. 5B, a buffer layer 104 and a hard mask 105 are sequentially formed on the substrate 100. The buffer layer 104 is formed of oxide, for example, silicon oxide ($SiO_2$). The buffer layer 104 may be formed by an oxidation process or a deposition process. In this embodiment, the buffer layer 104 is formed by the oxidation process. The hard mask 105 is formed of nitride, for example, silicon nitride (SiN or $Si_3N_4$). The hard mask 105 is formed by a low pressure chemical vapor deposition (LPCVD) process. A photoresist pattern 106 is formed on the hard mask 105.

Figure 5C:
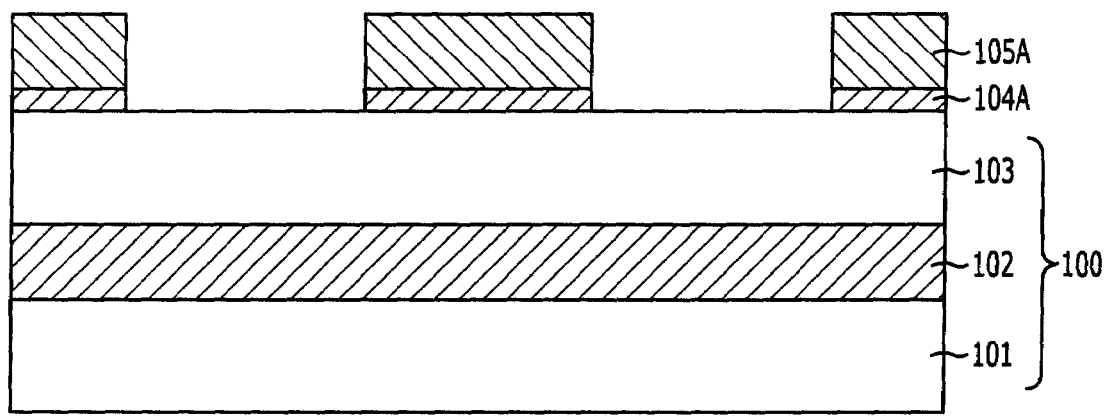

Referring to FIG. 5C, the hard mask 105 and the buffer layer 104 are etched by an etching process using the photoresist pattern 106 as an etching mask. Consequently, a hard mask pattern 105A and a buffer pattern 104A are formed. In this case, the etching process for forming the hard mask pattern 105A is performed by a dry etching process using plasma. Furthermore, the etching process for forming the buffer pattern 104A may be performed by a wet etching process using a buffered oxide etchant (BOE), which is a mixed solution of HF and $NH_4F$). The photoresist pattern 106 is removed.

Figure 5D:
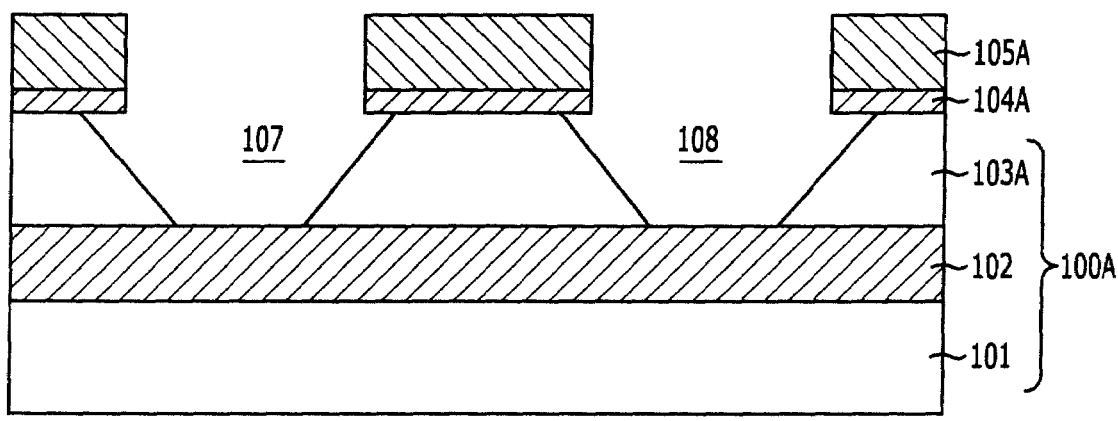

Referring to FIG. 5D, first and second trenches 107 and 108 spaced within the substrate 100A are formed by an etching process using the hard mask pattern 105 as an etching barrier layer. The etching process is performed by a vapor etching process. That is, the etching is performed using gaseous chemical materials, instead of plasma. The semiconductor layer 103A is selectively etched by an etching process to expose the buried insulation layer 102.

Since the vapor etching process is an etching using a chemical reaction, the selectivity is excellent and damage caused by plasma does not occur. Furthermore, an isotropic etching is possible. Moreover, although the vapor etching has the same characteristic as the wet etching, a reactive ion beam etching (RIE) reaction tube and a vapor etching reaction tube can be easily combined within a single equipment because a solution is not used.

The vapor etching process is performed at a temperature of approximately 600° C. to approximately 1,100° C. using hydrogen chloride (HCl) and chlorine gas (Cl2) as an etching gas. At this point, a pressure is maintained in a range of approximately 0.01 Torr to approximately 760 Torr. A temperature heat source may be obtained using a rapid temperature process (RTP) using a halogen ramp, or may be obtained using a heater.

Figure 5E:
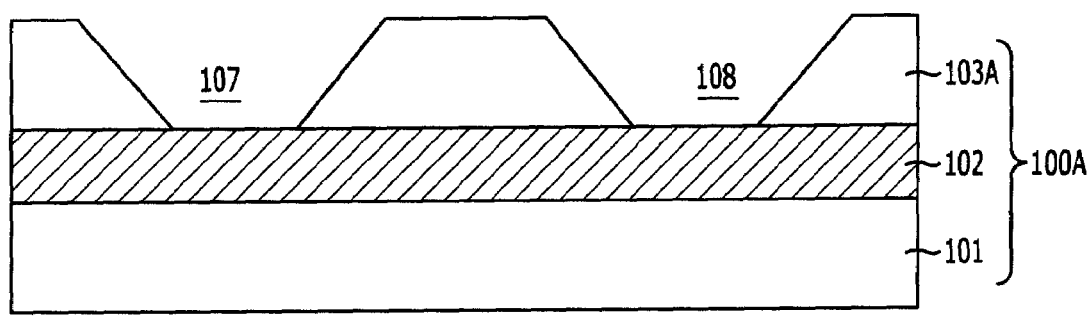

Referring to FIG. 5E, a passivation layer (not shown) may be formed on inner surfaces of the first and second trenches 107 and 108. The passivation layer may be formed by a deposition process or a thermal oxidation process. In this embodiment, the passivation layer is formed by the thermal oxidation process. Also, the passivation layer is formed to a thickness of approximately 100 Å to approximately 1,000 Å. The passivation layer protects the substrate 100A from a phosphoric acid solution ($H_3PO_4$) to be used in a subsequent process of removing the hard mask pattern 105 (see FIG. 5D).

The hard mask pattern 105A and the buffer pattern 104A are removed. The hard mask pattern 105A is removed using a phosphoric acid solution ($H_3PO_4$). The buffer pattern 104A is removed using a BOE or a diluted HF (DHF), which is HF solution diluted with $H_2O$). During this process, the passivation layer is also etched and removed partially or wholly.

Figure 5F:
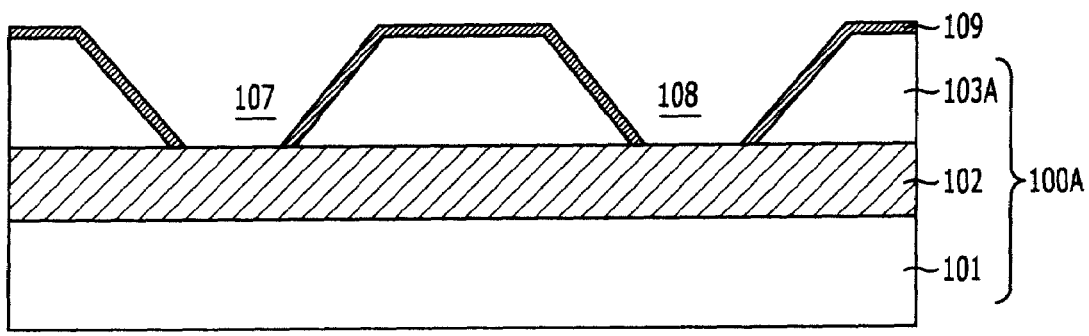

Referring to FIG. 5F, a gate insulation layer 109 is formed on the exposed semiconductor layer 103A including the first and second trenches 107 and 108. The gate insulation layer 109 is formed of silicon oxide ($SiO_2$). The gate insulation layer 109 is formed by an oxidation process such as a dry oxidation process or a wet oxidation process, or an oxidation process using radical ion. Furthermore, a nitride layer may be further formed between the gate insulation layer 109 and the semiconductor layer 103A.

Figure 5G:
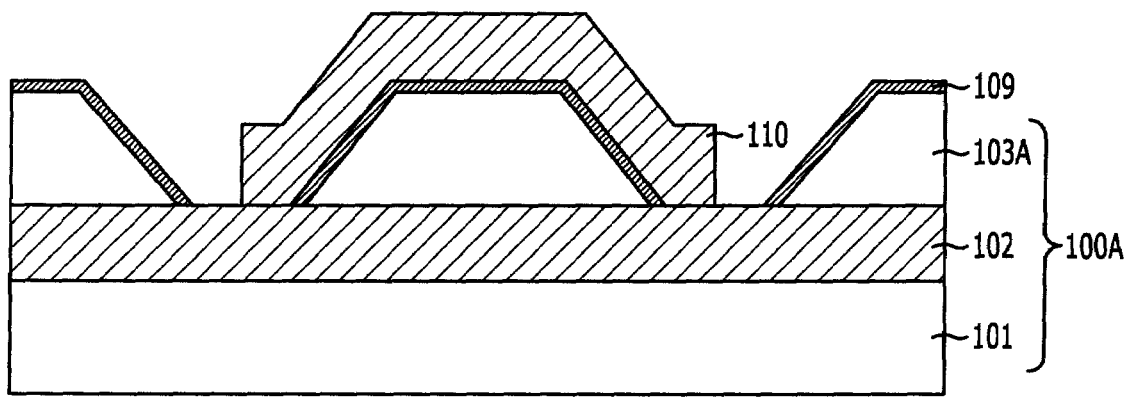

Referring to FIG. 5G, a gate conductive layer 110 is formed on the gate insulation layer 109. The gate conductive layer 110 may include a polysilicon layer, a transition metal layer, a metal silicide layer, a metal nitride layer, or a stacked structure thereof.

The gate conductive layer 110 and the gate insulation layer 109 are etched to form a gate electrode.

Source and drain regions 111 and 112 are formed within the semiconductor layer 103A exposed on both sides of the gate electrode.

Embodiment 2

FIGS. 6A to 6J are cross-sectional views illustrating a method for forming a triple gate of a semiconductor device in accordance with a second embodiment of the present invention.

Figure 6A:
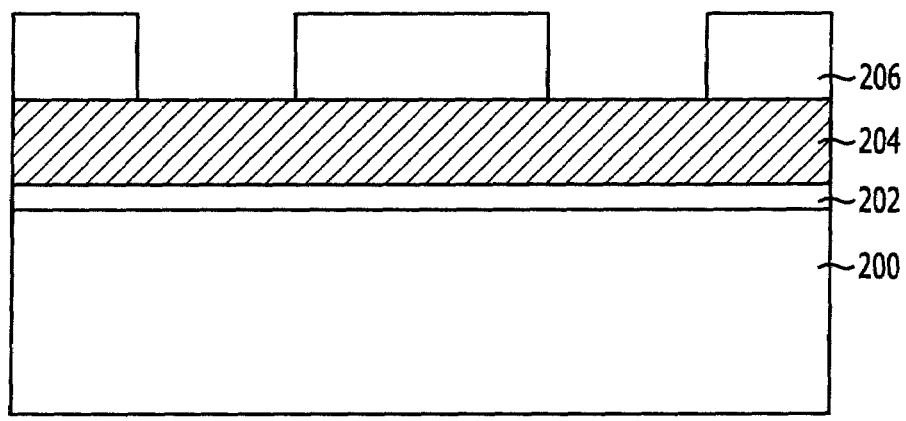
FIGS. 6A to 6J are cross-sectional views illustrating a method for forming a triple gate of a semiconductor device in accordance with a second embodiment of the present invention.

Referring to FIG. 6A, a buffer layer 202 and a hard mask 204 are formed on a substrate 200. The buffer layer 202 is formed of oxide, for example, silicon oxide ($SiO_2$). The buffer layer 202 may be formed by an oxidation process or a deposition process. In this embodiment, the buffer layer 202 is formed by the oxidation process. The hard mask 204 is formed of nitride, for example, silicon nitride (SiN or $Si_3N_4$). The hard mask 204 is formed by a low-pressure chemical vapor deposition (LPCVD) process. A photoresist pattern 206 is formed on the hard mask 204.

Figure 6B:
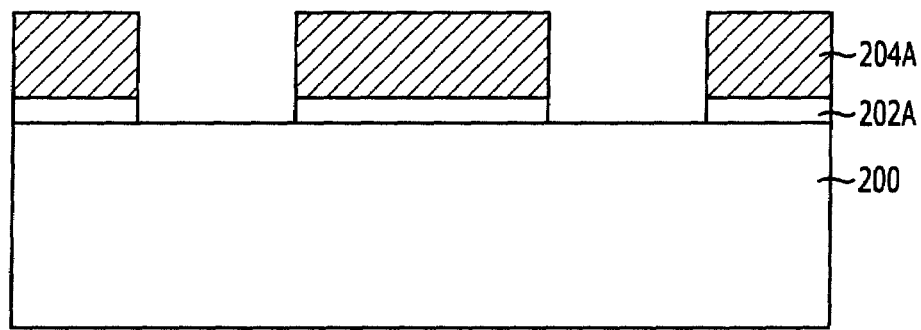

Referring to FIG. 6B, the hard mask 204 and the buffer layer 202 are etched by an etching process using the photoresist pattern 206 as an etching mask. Consequently, a hard mask pattern 204A and a buffer pattern 202A are formed. In this case, the etching process for forming the hard mask pattern 204A is performed by a dry etching process using plasma. Furthermore, the etching process for forming the buffer pattern 202A may be performed by a wet etching process using a buffered oxide etchant (BOE: mixed solution of HF and NH4F).

Figure 6C:
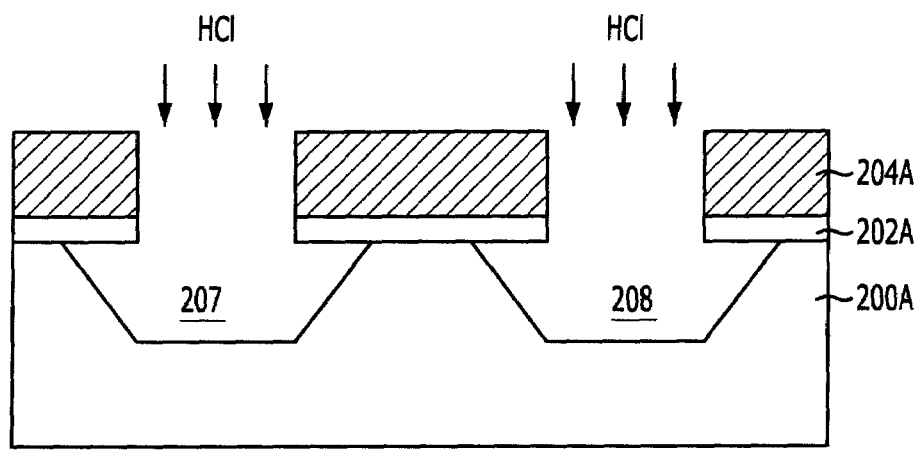

Referring to FIG. 6C, the photoresist pattern 206 is removed, and first and second trenches 207 and 208 spaced within the substrate 200A are formed by an etching process using the hard mask pattern 204A as an etching barrier layer. The etching process is performed by a vapor etching process. That is, the etching is performed using gaseous chemical materials, instead of plasma. Since the vapor etching process is an etching using a chemical reaction, the selectivity is excellent and damage caused by plasma does not occur.

Furthermore, an isotropic etching is possible. Moreover, although the vapor etching has the same characteristic as the wet etching, a reactive ion beam etching (RIE) reaction tube and a vapor etching reaction tube can be easily combined within a single equipment because a solution is not used. For example, the vapor etching process is performed using hydrogen chloride (HCl) and chlorine gas ($Cl_2$) as an etching gas at a temperature of approximately 600° C. to approximately 1,100° C. under a pressure of approximately 0.01 Torr to approximately 760 Torr. A temperature heat source may be obtained using a rapid temperature process (RTP) using a halogen lamp, or may be obtained using a heater.

Figure 6D:
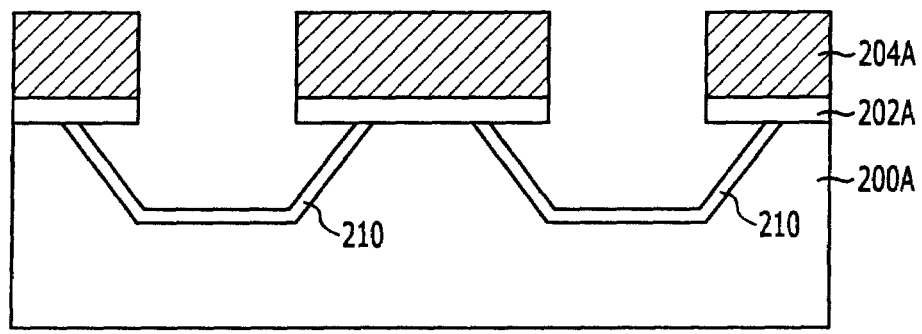

Referring to FIG. 6D, a passivation layer 210 is formed on inner surfaces of the first and second trenches 207 and 208 (see FIG. 6C). The passivation layer 210 is formed by a thermal oxide layer by an oxidation process. Also, the passivation layer 210 is formed to a thickness of approximately 100 Å to approximately 1,000 Å. The passivation layer 210 protects the substrate 200A from a phosphoric acid solution ($H_3PO_4$) to be used in a subsequent process of etching the hard mask pattern 204B (see FIG. 6E).

Figure 6E:
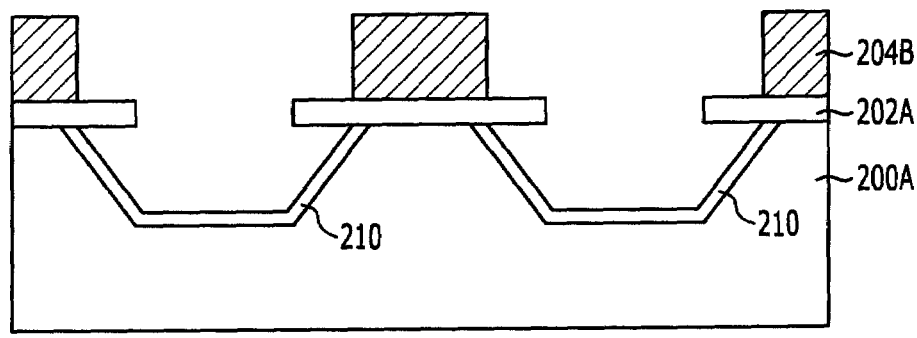

Referring to FIG. 6E, a part of the hard mask pattern 204B is etched. At this point, the etching process is performed until both sides of the hard mask pattern 204B are aligned at both edges of the first and second trenches 207 and 208 (see FIG. 6C). The etching process uses a phosphoric acid solution ($H_3PO_4$).

Figure 6F:
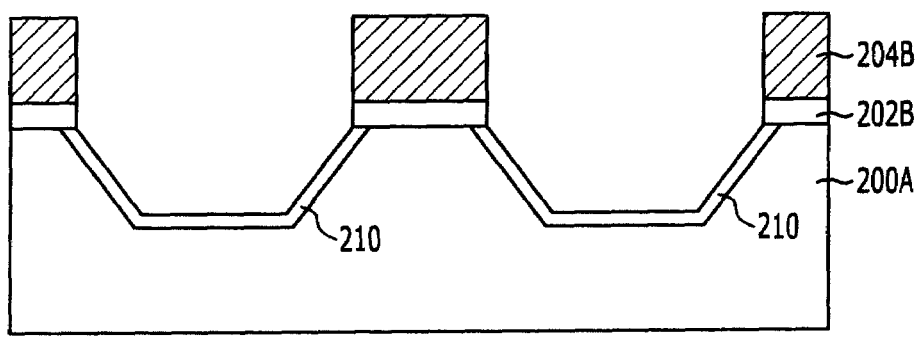

Referring to FIG. 6F, a part of the buffer pattern 202B is etched to align both sides with both sides of the hard mask pattern 204B. At this point, the etching process may use a BOE or a diluted HF (DHF), which is HF solution diluted with $H_2O$. Meanwhile, although the passivation layer 210 remains in FIG. 6F, the passivation layer 210 may be etched and removed partially or wholly.

Figure 6G:
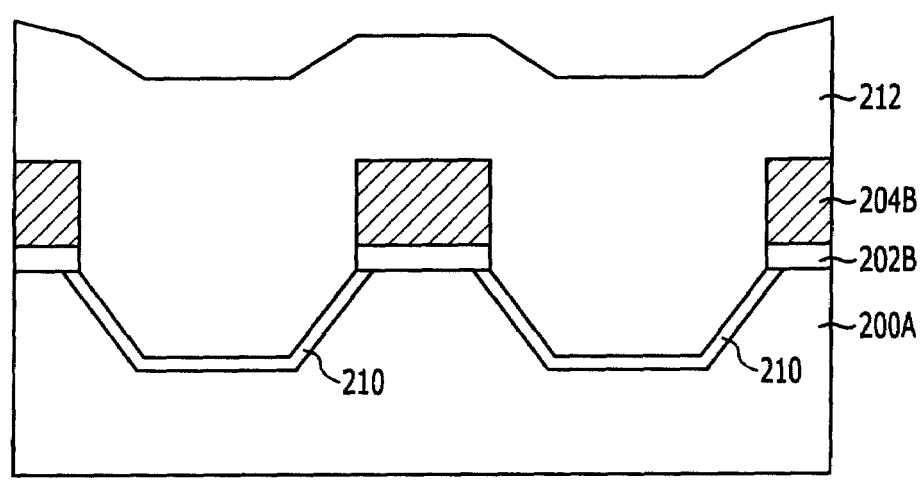

Referring to FIG. 6G, a buried insulation layer 212 is formed on the hard mask pattern 204B to fill the first and second trenches 207 and 208 (see FIG. 6C). The buried insulation layer 212 may be formed of a high-density plasma (HDP) layer or an undoped silicate glass (USG) layer.

Figure 6H:
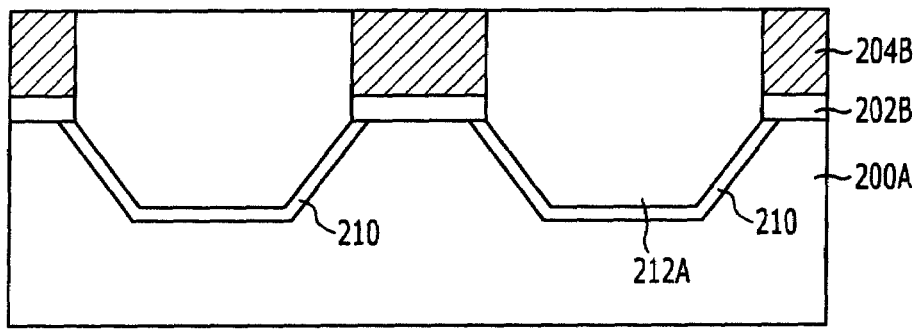

Referring to FIG. 6H, the buried insulation layer 212A is planarized. The planarization process is performed by a chemical mechanical polishing (CMP) process. The CMP process uses the hard mask pattern 204B as a polishing stop layer.

Figure 6I:
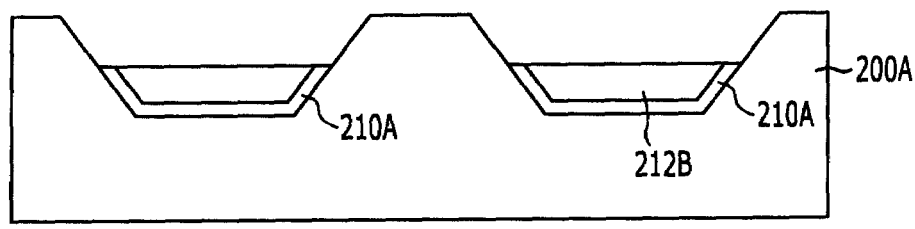

Referring to FIG. 6I, the hard mask pattern 204B (see FIG. 6H) and the buffer pattern 202B (see FIG. 6H) are removed. The process of removing the hard mask pattern 204B uses a phosphoric acid solution, and the process of removing the buffer pattern 202B uses a BOE or a DHF. Through these processes, the buried insulation layer 212B is also etched to a certain thickness and thus recessed.

Meanwhile, when an etching amount of the buried insulation layer 212B is small in the process of removing the buffer pattern 202B, a separate etching process may be performed to recess the buried insulation layer 212B. At this point, the etching process is performed until the upper wall of the inner walls of the first and second trenches 207A and 207B is partially exposed.

Figure 6J:
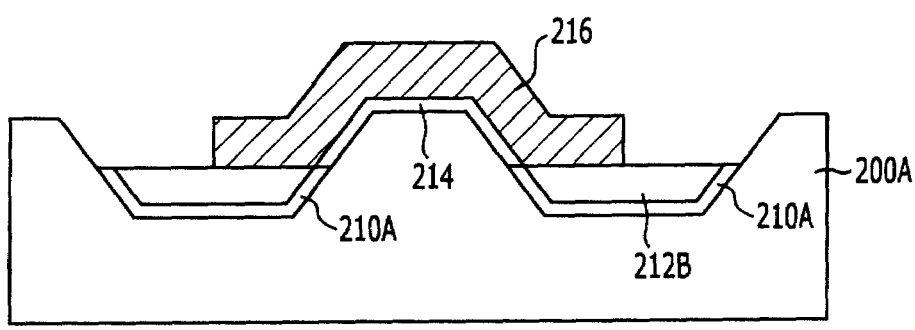

Referring to FIG. 6J, a gate insulation layer 214 is formed on the substrate 200A that is exposed without being covered by the buried insulation layer 212B. In this case, the gate insulation layer 214 is formed of silicon oxide ($SiO_2$). The gate insulation layer 214 is formed by an oxidation process such as a dry oxidation process or a wet oxidation process, or an oxidation process using radical ion. Furthermore, the gate insulation layer 214 may be formed so that a nitride layer is formed in an interface between the silicon oxide layer and the substrate 200A.

A conductive layer 216 is formed on the gate insulation layer 214. The conductive layer 216 may include a polysilicon layer or a transition metal layer.

The conductive layer 216 and the gate insulation layer 214 are etched to form a gate electrode.

Source and drain regions (not shown) are formed within the semiconductor layer 200A exposed on both sides of the gate electrode.

Embodiment 3

FIGS. 7A to 7F are cross-sectional views illustrating a method for forming a recess gate of a semiconductor device in accordance with a third embodiment of the present invention.

Figure 7A:
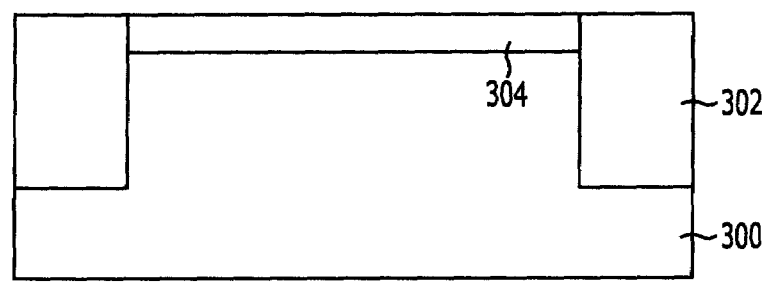
FIGS. 7A to 7F are cross-sectional views illustrating a method for forming a recess gate of a semiconductor device in accordance with a third embodiment of the present invention.

Referring to FIG. 7A, a device isolation layer 302 is formed in a substrate 300 by a shallow trench isolation (STI) process, and a buffer layer 304 is formed on the substrate 300. The buffer layer 304 is formed of oxide, for example, silicon oxide ($SiO_2$). Specifically, the buffer layer 304 is formed of a thermal oxide layer or a tetra ethyl ortho silicate (TEOS) layer. The buffer layer 304 may be formed by an oxidation process or a deposition process. The oxidation process includes a dry oxidation process or a wet oxidation process. The deposition process includes a CVD process or a physical vapor deposition (PVD) process.

Figure 7B:
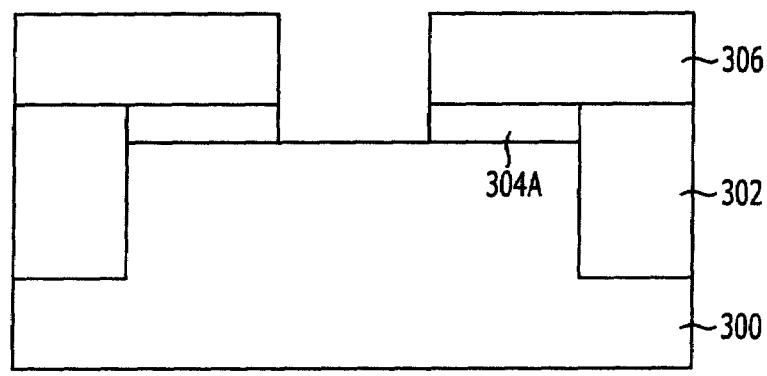

Referring to FIG. 7B, a photoresist pattern 306 is formed on the buffer layer 304. The buffer layer 304 is etched by an etching process using the photoresist pattern 306 as an etching mask. Consequently, a buffer pattern 304A is formed. In this manner, a trench region in which a part of the recess gate will be buried is defined.

Figure 7C:
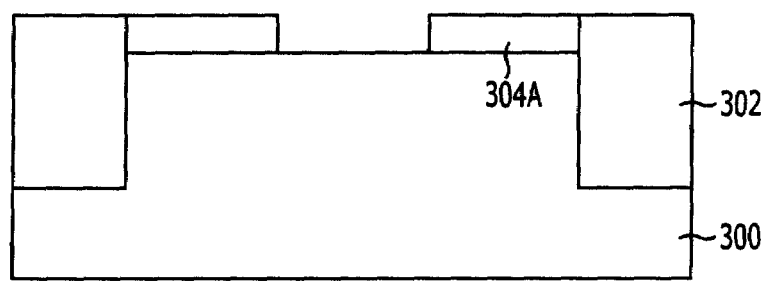

Referring to FIG. 7C, the photoresist pattern 306 (see FIG. 7B) is removed.

Figure 7D:
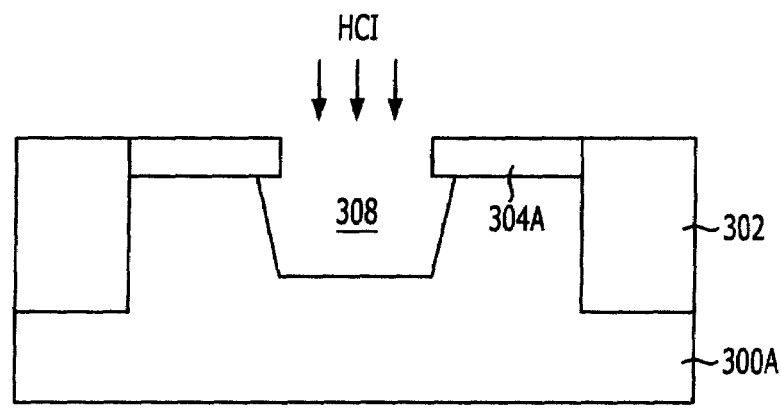

Referring to FIG. 7D, a trench 308 is formed within the substrate 300A by an etching process using the buffer pattern 304A as an etching barrier layer. The etching process is performed by a vapor etching process. That is, the etching is performed using gaseous chemical materials, instead of plasma. Since the vapor etching process is an etching using a chemical reaction, the selectivity is excellent and damage caused by plasma does not occur. Furthermore, an isotropic etching is possible.

Moreover, although the vapor etching has the same characteristic as the wet etching, a reactive ion beam etching (RIE) reaction tube and a vapor etching reaction tube can be easily combined within a single equipment because a solution is not used. For example, the vapor etching process is performed using hydrogen chloride (HCl) and chlorine gas ($Cl_2$) as an etching gas at a temperature of approximately 600° C. to approximately 1,100° C. under a pressure of approximately 0.01 Torr to approximately 760 Torr. A temperature heat source may be obtained using a rapid temperature process (RTP) using a halogen ramp, or may be obtained using a heater.

Figure 7E:
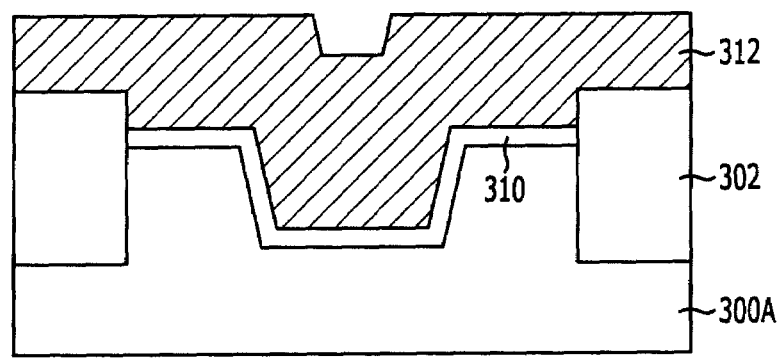

Referring to FIG. 7E, the buffer pattern 304A (see FIG. 7A) is removed by an etching process. At this point, the etching process may be performed using a buffered oxide etchant (BOE), which is a mixed solution of HF and $NH_4F$ or a diluted HF (DHF).

A gate insulation layer 310 is formed on the substrate 300A along the inner surfaces of the trench 308 (see FIG. 7D). In this case, the gate insulation layer 310 is formed of silicon oxide ($SiO_2$). The gate insulation layer 310 is formed by an oxidation process such as a dry oxidation process and a wet oxidation process, or an oxidation process using radical ion. Furthermore, the gate insulation layer 310 may be formed so that a nitride layer is formed in an interface between the silicon oxide layer and the substrate 300A.

A gate conductive layer 312 is formed on the gate insulation layer 310. The gate conductive layer 312 may include a polysilicon layer or a transition metal layer.

Figure 7F:
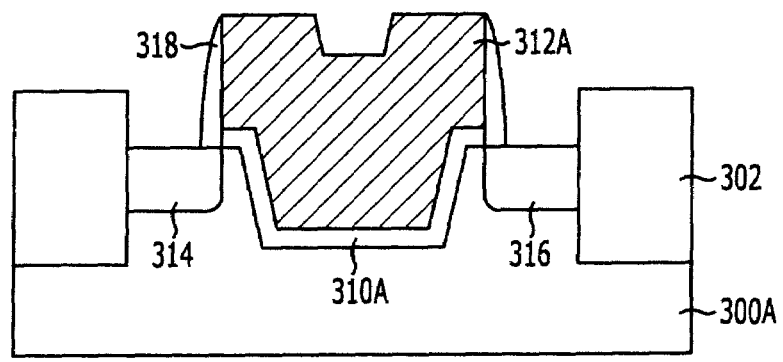

Referring to FIG. 7F, the gate conductive layer 310 and the gate conductive layer 312 are etched to form a gate electrode including a gate conductive pattern 312 and a gate insulation pattern 210A.

Source and drain regions 314 and 316 are formed within the semiconductor layer 300A exposed on both sides of the gate electrode.

A spacer 318 is formed on either sidewall of the gate electrode. The spacer 318 includes an oxide layer, a nitride layer, or a stacked layer thereof.

The embodiments of the present invention can obtain the following effects.

First, by forming the trench using the vapor etching process, damage caused by plasma does not occur, thus improving characteristic and reliability of the device.

Second, by forming the trench by the vapor etching process using hydrogen chloride gas (HCl), the side 20 and the upper surface 10 of the trench are exposed due to characteristic of the HCL vapor etching process. Thus, the surface having a slope close to 45° in the cross section is formed, thus weakening the intensity of the electric field concentrated on the upper edge portion.

Third, since the SOI substrate is used, the STI process for forming the device isolation layer may be omitted, simplifying the manufacturing process. That is, since the first and second trenches are expanded up to the buried insulation layer, devices can be isolated from each other. Thus, there is no need to perform a separate STI process for forming the device isolation layer.

While the present invention has been described with respect to the specific embodiments, it will be apparent to those skilled in the art that various changes and modifications may be made without departing from the spirit and scope of the invention as defined in the following claims.

What is claimed is:

1. A method for forming a triple gate of a semiconductor device, the method comprising:
    forming a buffer layer and a hard mask over a substrate;
    etching the hard mask and, the buffer layer to form a hard mask pattern and a buffer pattern;
    forming first and second trenches spaced apart within the substrate by partially etching the substrate by a vapor etching process using the hard mask pattern as an etching harrier layer;
    forming a passivation layer on inner surfaces of the first and second trenches;
    partially etching, by a first etching process, the hard mask pattern to align both sides of the hard mask patterns with both edges of the first and second trenches;
    subsequently partially etching, by a second etching process separate from the first etching process, the buffer pattern to align both sides of the buffer pattern with both edges of the first and second trenches;
    forming a buried insulation layer to fill the first and second trenches;
    removing the hard mask pattern and the buffer pattern;
    recessing a part of the buried insulation layer to partially expose sidewalls of the first and second trenches;
    forming a gate insulation layer directly contacting a top surface of the substrate and directly contacting the exposed sidewalls of the trenches between the first trench and the second trench, the substrate being exposed as result of removing the hard mask pattern and the buffer pattern;
    forming a gate electrode on the gate insulator layer which partially covers the buried insulation layer.

2. The method of claim 1, wherein the vapor etching process is performed using hydrogen chloride (HCl) or chlorine ($Cl_2$).

3. The method of claim 2, wherein the vapor etching process is performed at a temperature of approximately 600" C. so approximately 1,100" C.

4. The method of claim 3, wherein the vapor etching process is performed under a pressure of approximately 0.01 Torr to approximately 760 Torr.

5. The method of claim 1, wherein the passivation layer is formed by an oxidation process or a deposition process.

6. The method of claim 1, wherein the passivation layer comprises a thermal oxide layer formed to a thickness of approximately 100 Å to approximately 1,000 Å.

7. The method of claim 1, wherein the hard mask pattern comprises a nitride layer, and the buffer pattern comprises an oxide layer.

8. The method of claim 7, wherein the hard mask pattern is partially etched using a phosphoric acid solution, and the buffer pattern is partially etched using a buffered oxide etchant (BOE) or a diluted HF (DHF).

9. The method of claim 1, wherein the buried insulation layer comprises a high-density plasma (HDP) layer or an undoped silicate glass (USG) layer.

10. The method of claim 1, wherein forming the buried insulation layer comprises:

depositing a buried insulation layer to fill the first and second trenches; and polishing the buried insulation layer using the hard mask pattern as a polishing stop layer.

11. The method of claim 1, wherein the substrate comprises a support substrate, a semiconductor substrate and a buried oxide layer located between the support and the semiconductor substrate.

12. The method of claim 1, wherein a space width between the first trench and the second trench is smaller than a width of the hard mask pattern after the vapor etching process.

13. The method of claim 1, wherein a part of the substrate under the hard mask is etched after the vapor etching process.

14. The method of claim 1, wherein the recessing the buried insulation layer is performed by the removing of the buffer pattern.

15. The method of claim 1, wherein:

the first etching process comprises a dry etching process; and the second etching process comprises a wet etching process.

16. The method of claim 1, wherein:

the first etching process comprises a wet etching process; and the second etching process comprises a wet etching process.

\* \* \* \* \*